United States Patent [19]
Min et al.

[11] Patent Number: 5,157,278
[45] Date of Patent: Oct. 20, 1992

[54] SUBSTRATE VOLTAGE GENERATOR FOR SEMICONDUCTOR DEVICE

[75] Inventors: Dong Sun Min; Dong Il Seo, both of Seoul, Rep. of Korea

[73] Assignee: Samsung Electronics Co., Ltd., Suweon, Rep. of Korea

[21] Appl. No.: 606,031

[22] Filed: Oct. 30, 1990

[51] Int. Cl.$^5$ .............................................. G05F 3/16
[52] U.S. Cl. ........................... 307/296.2; 307/296.1; 307/296.8; 365/189.06
[58] Field of Search ............... 307/296.1, 296.2, 296.8; 365/189.06

[56] References Cited
U.S. PATENT DOCUMENTS

| | | | |
|---|---|---|---|
| 4,794,278 | 12/1988 | Vajdic | 307/296.2 |
| 4,825,142 | 4/1989 | Wang | 307/296.2 |
| 4,843,256 | 6/1989 | Seade et al. | 307/296.2 |
| 4,964,082 | 10/1990 | Sato et al. | 307/296.2 |
| 5,003,197 | 3/1991 | Nojima et al. | 307/296.2 |

Primary Examiner—Stanley D. Miller
Assistant Examiner—Scott A. Ouellette
Attorney, Agent, or Firm—Ladas & Parry

[57] ABSTRACT

The present invention relates to a substrate voltage generator for a semiconductor device, comprising an oscillator for generating an oscillating signal to compensate the resistance value with temperature, a voltage pump driver for providing clock signals, a voltage pump for generating substate voltage, a level detector for detecting the substrate voltage, and a oscillating driver for providing the bias voltage, wherein the power consumption in the standby state of semiconductor devices can be reduced and the driving capacity is not variable even though the temperature is changed.

7 Claims, 4 Drawing Sheets

SUBSTRATE VOLTAGE GENERATOR FOR SEMICONDUCTOR DEVICE

BACKGROUND OF THE INVENTION

The present invention relates to a circuit for a semiconductor device, and more particularly to a substrate voltage generator included inside the semiconductor device.

Recently, as the integration density of the semiconductor device increases, the size of transistors becomes more minute, thereby degrading the reliability on the supply voltage and increasing the power consumption. Thus, most semiconductor devices include a substrate voltage generator to stabilize the threshold voltage of MOS (Metal Oxide Semiconductor) Transistor, to reduce junction capacitances, and to prevent parasitic transistors and incorrect operations due to the undershoot of external TTL (Transistor-Transistor Logic) gates. There are two methods for the generation of substrate: one is controlling the pumping by detecting the substrate voltage if it is far from a predetermined value, and the other is controlling the pumping capacitance by detecting the level of $\overline{RAS}$(Row Address Strobe) signals.

However, the conventional substrate voltage generator is degraded at high temperature, thereby resulting in the unstability of the substrate voltage. Particularly, in the case of CMOS (Complementary MOS) circuits, the latch-up characteristics are apt to be weakened. This degradation is mainly caused by an oscillator in the substrate voltage generator. That is, as the temperature increases, the oscillation frequency of the oscillator decreases, thereby varying the substrate voltage. Also, as the semiconductor device becomes smaller, the driving capacity of the substrate voltage generator is lowered so that the incorrect operation occurs easily and the reliability is degraded.

SUMMARY OF THE INVENTION

It is an object of the present invention to provide a substrate voltage generator which stabilizes the substrate voltage by improving the driving capacity.

It is another object of the present invention to provide a substrate voltage generator which reduces the power consumption in the standby state of semiconductor devices.

It is still another object of the present invention to provide a substrate voltage generator of which driving capacity is not changed by the variation in temperature, thereby enhancing the reliability.

According to the present invention, there is provided a substrate voltage generator for a semiconductor device, comprising: an oscillator for generating an oscillating signal of which oscillating period is not variable by compensating the resistance value according to the variation in temperature; a voltage pump driver for providing two clock signals, each having a phase difference of 180° with each other by receiving the soscillating signal of said oscillator; a voltage pump for generating substrate voltage by receiving the clock signals of said voltage pump driver; a level detector for providing a clock signal when the substrate voltage is not maintained at a predetermined level; and an oscillator driver for providing the bias voltage of said oscillator according to the clock signal of said level detector.

BRIEF DESCRIPTION OF THE DRAWINGS

These and other objects, features, and advantages of the present invention will become more apparent from the following description for the preferred embodiments taken in conjunction with the accompanying drawings, in which.

DETAILED DESCRIPTION OF THE PREFERRED EMBODIMENT

The present invention will be now described in more detail with reference to the accompanying drawings.

Figure 1:
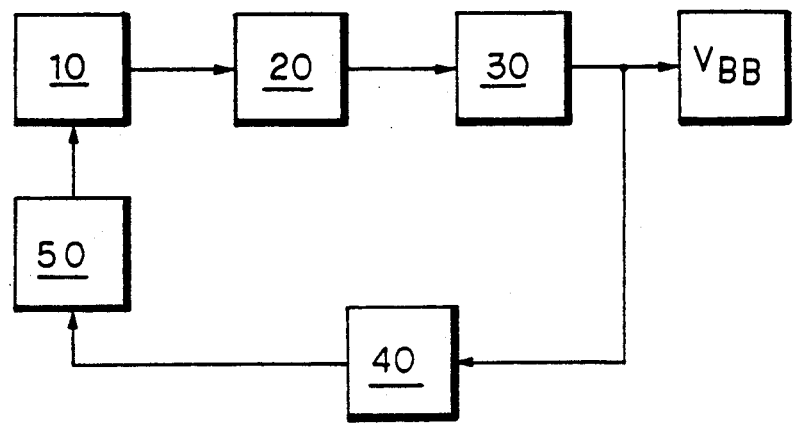
FIG. 1 is a block diagram of a substrate voltage generator circuit according to the present invention.

FIG. 1 shows a block diagram of a substrate voltage generator according to the present invention. The substrate voltage generator includes an oscillator 10, a voltage pump driver 20, a voltage pump 30, a level detector 40, and an oscillating driver 50. The oscillator 10 provides a predetermined oscillating signal $\phi OSC$ of which oscillating period is not variable according to the temperature since the resistance value is compensated according to the temperature variation. The voltage pump driver 20 generates two clock signals CK and $\overline{CK}$ in response to receiving the oscillating signal $\phi OSC$. The voltage pump 30 generates a negative substrate voltage $V_{BB}$ in response to receiving two clock signals CK and $\overline{CK}$. Also, the level detector 40 detects the state of the substrate voltage $V_{BB}$, and the oscillating driver 50 provides bias voltages Vop and Von if the detected level of the substrate voltage $V_{BB}$ is not desirous.

Figure 2:
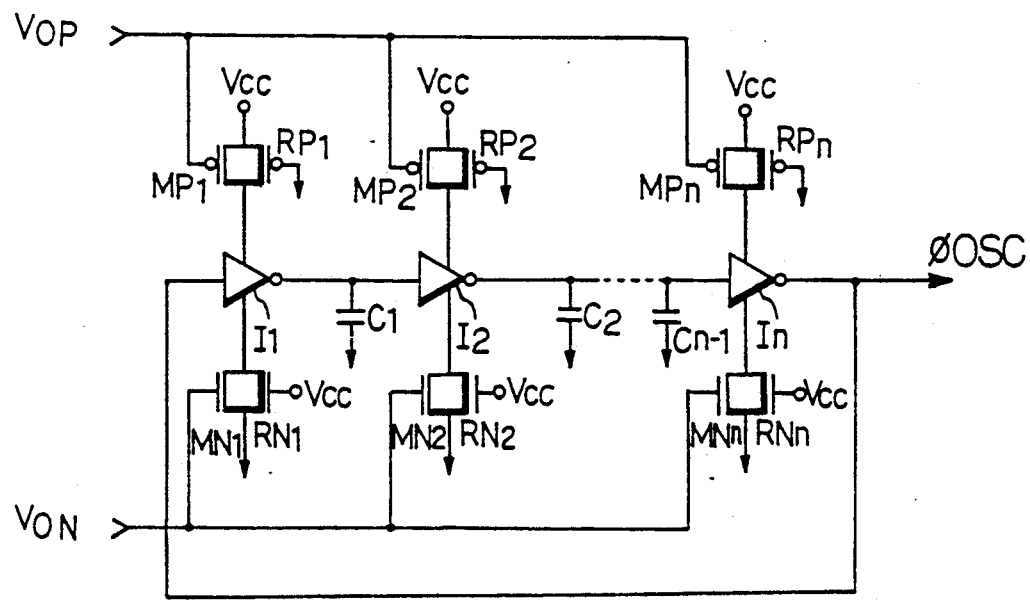
FIG. 2 is a detailed circuit diagram of an oscillator according to the present invention.

FIG. 2 shows a detailed circuit diagram of the oscillator 10 in FIG. 1. In FIG. 2, the oscillator 10 has n(odd number) inverters I1~In which are connected in series and together form a ring oscillator. Also, PMOS transistor MP1~MPn and RP1~RNn are respectively connected between supply voltage terminals Vcc and the inverters I1~In while NMOS transistors MN1~NMn and RN1~RNn are respectively connected between ground terminals and the inverters I1~ In. The output voltage $V_{Tp}$ of the oscillator 10 maintains the gate voltage n.$V_{Tp}$ according to the sum of the threshold voltage $V_{Tp}$ of the PMOS transistors MP1~MPn.

However, the absolute value of the threshold voltage $V_{Tp}$ is reduced due to the increase of temperature so the PMOS transistors MP1~MPn are apt to be turned off due to the increase of the gate voltage. Therefore, in order to prevent the change in the oscillating period, the resistance value corresponding to the increase of temperature should be compensated in such a manner that the PMOS transistors MP1~MPn are paralled in the PMOS transistors RP1~RPn which are always turned on with grounded gates thereof.

On the other hand, if NMOS transistors MN1~MNn are connected between the inverters I1~In and ground terminals and gate voltages are maintained on Vcc-nT$\tau$n, the NMOS transistors MN1~MNn are apt to be turned off in response to the increase of the absolute value of the threshold voltage V due to the increase of temperature. Therefore, in order to solve this problem, the NMOS transistors RN1~RNn connected with the power supply Vcc at the gates thereof should be paralled in the MOS transistors MN1~MNn.

Figure 3:
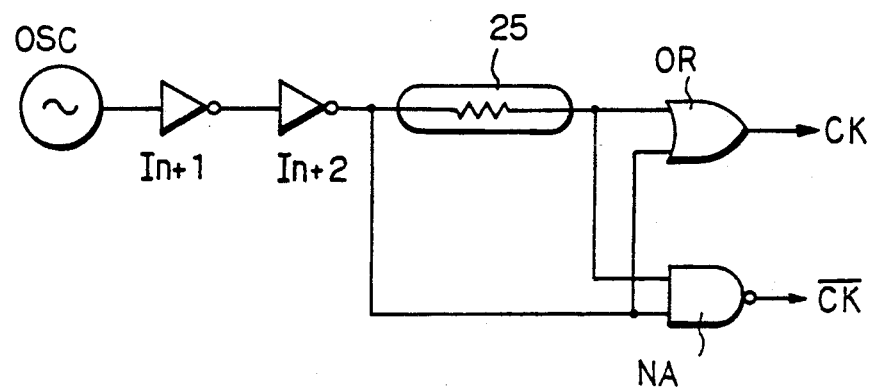
FIG. 3 is a detailed circuit diagram of a voltage pump driver according to the present invention.

FIG. 3 shows a detailed circuit diagram of the voltage pump driver 20 in FIG. 1. The voltage pump driver 20 comprises two buffering inverters In+1 and In+2 for buffering the input buffering signal $\phi$OSC provided from the oscillator 10, delay means 25 for delaying the output signal from the inverters In+1 and In+2 for a predetermined period, and OR and NAND gates which provides the clock signals CK and $\overline{CK}$. If a high level pulse is applied from the oscillator 10 for a predetermined period, it is applied to the delay means 25 and the input terminals of the OR and NAND gates through the buffering inverters In+1 and In+2. Also, the delayed signal by the delay means 25 is applied to the other input terminals of the OR and NAND gates, respectively.

Then, the OR gate provides a high level clock signal CK, which rises at the rising edge of the buffered signal by the inverters In+1 and In+2 and falls at the falling edge of the output signal of the delay means 25. Also, the NAND gate provides a low level clock signal $\overline{CK}$, which falls at the rising edge of the output signal of the delay means 25 and rises at the falling edge of the buffered signal by the inverter In+1 and In+2. Thus, the OR gate provides the clock signal CK of which high interval is extended by the delay time of the delay means 25, and also provides clock signal $\overline{CK}$ which has a phase difference of 180° from the clock signal CK. Moreover, if the oscillator 10 provides a low level oscillating signal $\phi$OSC, each OR and NAND gates provides the clock signals CK and $\overline{CK}$ in an opposite manner.

Figure 4:
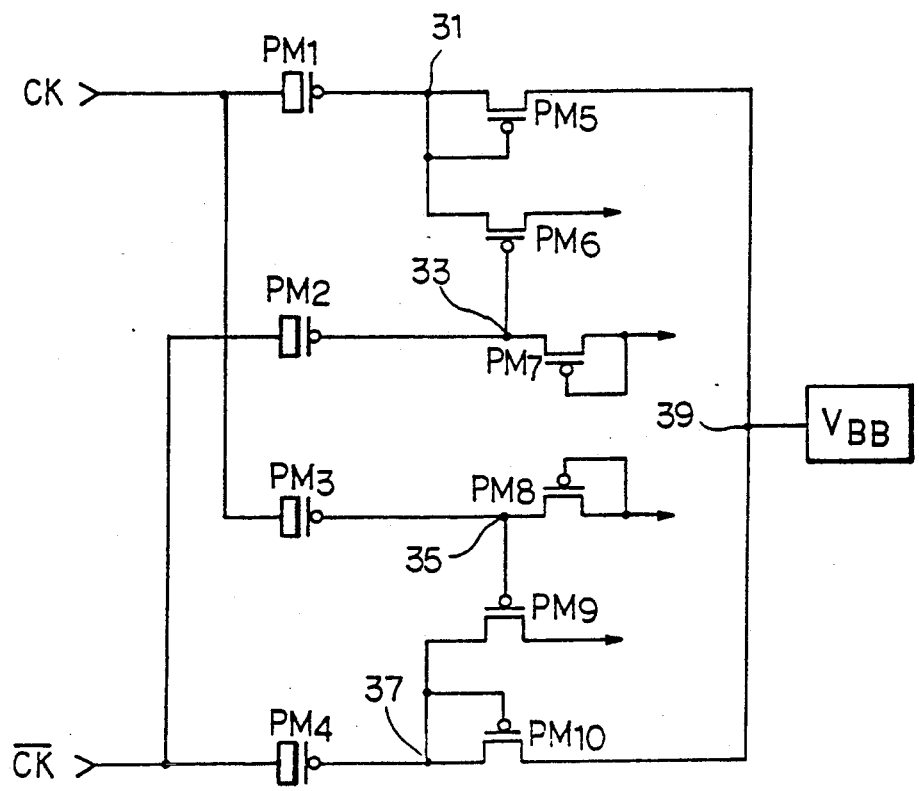
FIG. 4 is a detailed circuit diagram of an embodiment illustrating a voltage pump according to the present invention.

FIG. 4 shows a detailed circuit diagram of the voltage pump 30 as shown in FIG. 1. The voltage pump 30 includes PMOS transistors PM1~PM10. The PMOS transistors PM1~PM4 are to serve as pumping capacitors by applying the clock signals CK and $\overline{CK}$. The PMOS transistor P5 and P10 are to serve as diodes of which sources are connected with a substrate voltage node 39 and also gates and drains are commonly connected with nodes 31 and 37 to be pumped with a negative voltage value. The PMOS transistors P6 and P9 have sources connected with the nodes 31 and 37, grounded drains, and gates connected with the gates of the PMOS transistors PM2 and PM3 so as to lead the substrate current to the ground terminals from the substrate voltage rod 39. The PMOS transistors P7 and P8 have gates and sources commonly connected each other to be grounded, and drains connected to the gates of the PMOS transistors PM6 and PM9 so as to prevent the gate voltage from rising higher than the threshold voltage. The PMOS transistors PM1~PM4 are formed of a capacitor in such a manner that their sources and drains bind together are applied with the clock signals CK and $\overline{CK}$, respectively.

If the oscillator 10 provides a high level oscillating signal $\phi$OSC, the voltage pump driver 20 provides a high level clock signal CK and a low level clock signal $\overline{CK}$ delayed for a predetermined period to the voltage pump 30. Such clock signals CK and $\overline{CK}$ are applied to the PMOS transistors PM1~PM4 serving as the pumping capacitance. Thus, the potential at the nodes 33 and 37 becomes a negative value −Vcc by the pumping capacitance of the PMOS transistors PM2 and PM4, respectively. Also, the potential at the node 31 becomes the ground level by the PMOS transistor PM1 and PM6 and the potential at a node 35 corresponds to the threshold voltage V$\tau$p by the PMOS transistors PM3 and PM8.

Then, the PMOS transistor PM10 is turned on and thus the substrate current flowing from the substrate voltage node is stored at the node 37. Simultaneously, the substrate current stored at the node 31 is grounded through the PMOS transistor PM6 during the previous period in which the oscillating signal $\phi$OSC applied from the oscillator is in a low level state is discharged to the ground through the PMOS transistor PM6.

Moreover, if the oscillating signal $\phi$OSC is applied, in a low level state the voltage pump driver 20 provides the low level clock signal CK and the high level clock signal $\overline{CK}$.

Then, the substrate current is stored at the node 31 and the substrate current at the node 37 is grounded through the PMOS transistor PM9, where the clock signals CK and $\overline{CK}$ are not converted into a low level state, even though the state of the oscillating signal $\phi$OSC is changed. Thus, it is prevented that the substrate voltage V$_{BB}$ becomes a positive voltage value due to the direct connection of the substrate voltage node 39 and the ground voltage terminal.

As mentioned above, the voltage pump circuit is driven by the clock signals CK and $\overline{CK}$ so that the pumping efficiency is increased and the substrate voltage is maintained stable. Also, if the voltage pump 30 comprising the PMOS transistors PM1~PM10 is implemented by CMOS technology with N-type well, the latch-up can be prevented.

Figure 5:
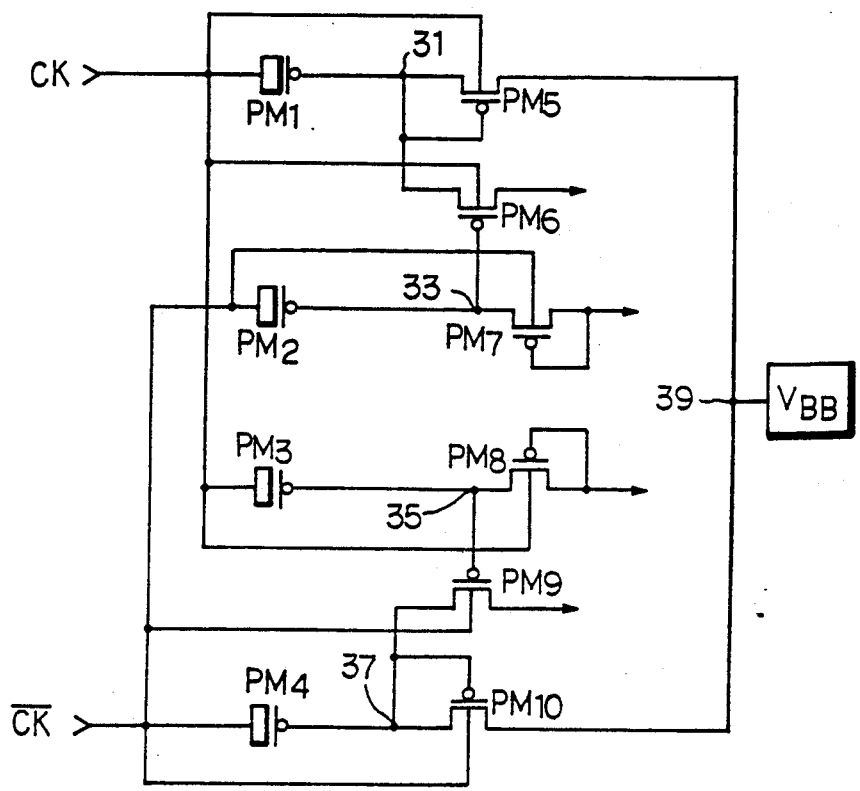
FIG. 5 is a detailed circuit diagram of another embodiment illustrating another voltage pump according to the present invention.

FIG. 5 shows another embodiment of the voltage pump 30 in FIG. 1. In FIG. 5, the clock signals CK and $\overline{CK}$ are applied to the substrate nodes of the PMOS transistors PM5~PM10, except the PMOS transistors PM1~PM4 which are used as the pumping capacitors respectively.

To describe in detail, the clock signal CK is applied to the substrates of the PMOS transistors PM5, PM6, and PM8, while the clock signal $\overline{CK}$ is applied to the substrates of the PMOS transistors PM7, PM9 and PM10. Thus, the ON/OFF characteristics of the PMOS transistors are improved in such a manner that the threshold voltage is decreased in the turn-on state, while it is increased in the turn-off state. Thus the pumping efficiency is even more improved.

Figure 6A:
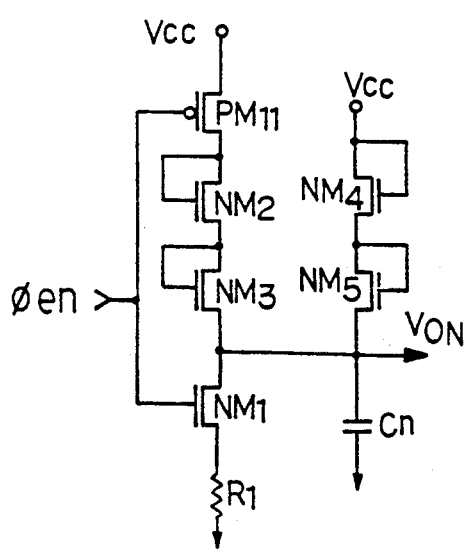
FIGS. 6A and 6B are detailed circuit diagrams of the components of an oscillating driver according to the present invention.
Figure 6B:
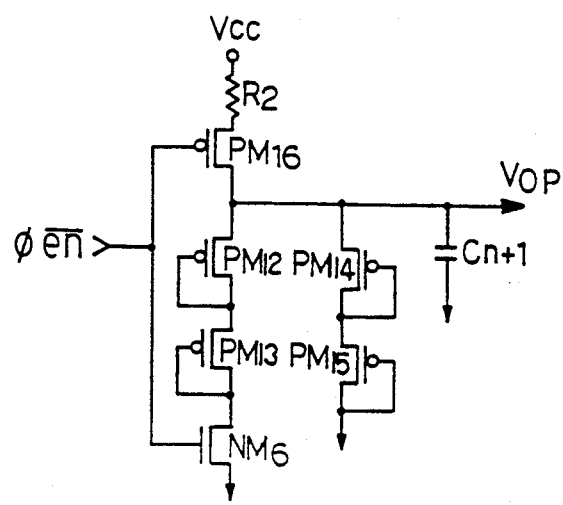

FIGS. 6A and 6B show a detailed circuit diagrams of components of the oscillating driver 50 in FIG. 1. The oscillating driver 50 is connected to the level detector 40 so that the enable signals $\phi$en and $\overline{\phi}$en which is provided from the level detector 40 after detecting the level state of the substrate voltage V$_{BB}$ are applied to the gates of PMOS and NMOS transistors (PM11, NM1) and (PM16, PN6) which form an inverter together. NMOS transistors NM2 and NM3 are connected between the PMOS transistor PM11 and an output terminal to serve as diodes, and a bias resistor R1 is connected between the NMOS transistor NM1 and the ground.

In addition, two NMOS transistors NM4 and NM5 to act as diodes are connected between the power supply and the output terminal, and a capacitor Cn is connected between the output terminal and the ground. A resistor R2 is connected between the power supply and the PMOS transistor PM16 and PMOS transistors PM12 and PM13 are connected between the output terminal and the NMOS transistor NM6. Also, PMOS transistors PM14 and PM15 are serially connected between the output terminal and ground in parallel with a capacitor $C_{n+1}$.

If the node 39 of the voltage pump 30 is not maintained at its desired level, the clock signals $\phi en$ and $\overline{\phi en}$ provided from the level detector 40 become high and low levels, respectively. Therefore, the clock signals $\phi en$ and $\overline{\phi en}$ make the PMOS and NMOS transistors PM11 and NM6 turned on to output the bias voltages Von and Vop to the oscillator 10 for actuating the oscillator 10, where the bias voltages Von and Vop are as follows; $Von = Vcc - 2 V_{Tn}$ and $Vop = 2 V_{Tp}$. The bias voltage Von corresponds to each threshold voltage of each NMOS transistor NM2 and NM3, and the bias voltage Vop corresponds to each threshold voltage of each PMOS transistors PM12 and PM13.

On the other hand, if the node 39 of the voltage pump driver 30 has a desired level, each clock signals $\phi en$ and $\overline{\phi en}$ of the level detector 40 becomes low and high levels, respectively. Therefore, such clock signals $\phi en$ and $\overline{\phi en}$ make the NMOS and PMOS transistors NM1 and PM16 turned on to control the bias voltages $V_{Tn}$ and $V_{Tp}$ so that the oscillator 10 is not actuated and the node 39 maintains the desired level continuously.

Figure 7:
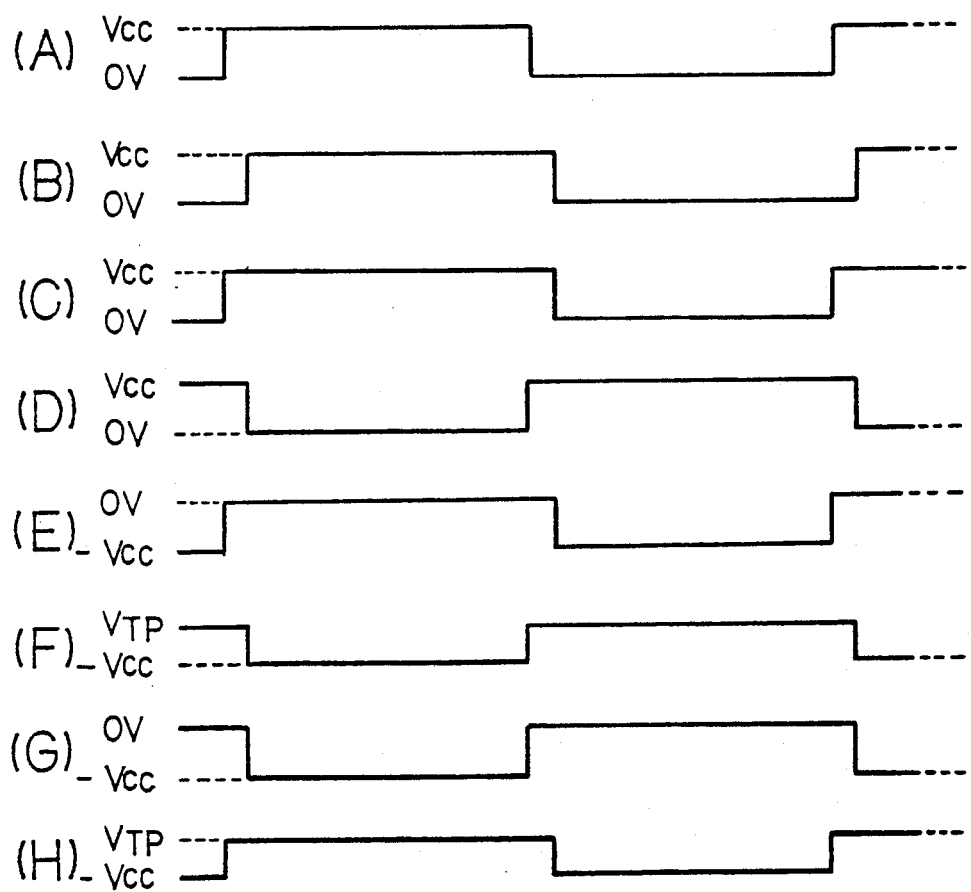
FIG. 7 is a waveform chart according to the present invention.

FIG. 7(A)~FIG. 7(D) show the output waveforms of the respective parts in the substrate voltage generator. FIG. 7(A) shows an oscillating signal $\phi OSC$ provided from the oscillator 10. FIG. 7(B) shows a delay means 25 in the voltage pump driver 20.

FIG. 7(C) and FIG. 7(D) show the clock signals CK and $\overline{CK}$ provided from the voltage pump driver 20 according to the combination of those shown in FIG. 7(C) and FIG. 7(D). In the clock signals CK and $\overline{CK}$, the high interval thereof is longer than the oscillating signal $\phi OSC$ by the delay time of the delay means 25, while the low interval is shorter than the oscillation signal $\phi OSC$. Thus, the clock signals CK and $\overline{CK}$ are not changed to the low state at the same time. Also, FIG. 7(E)~(H) show the voltage waveforms at the nodes 31, 33, 35 and 37, where the voltages at the nodes 31 and 37 do not become the low level at the same time, so that the substrate voltage is maintained stable.

As mentioned up to now, the present invention makes the driving capacity unchanged by compensating the resistance value according to the temperature variation, thereby improving the reliability of semiconductor devices and reducing the power consumption at the standby state.

The invention is in no way limited to the embodiment described hereinabove. Various modifications of disclosed embodiment as well as other embodiments of the invention will become apparent to persons skilled in the art upon reference to the description of the invention. It is therefore contemplated that the appended claims will cover any such modifications or embodiments as fall within the true scope of the invention.

What is claimed is:

1. A substrate voltage generator for a semiconductor device having a substrate comprising:
    an oscillator for generating an oscillating signal, an oscillation period of which is maintained constant by means for compensating for temperature variations;
    a voltage pump driver for providing two clock signals having a phase difference of 180 degrees relative to each other in response to the oscillating signal received from said oscillator;
    a level detector for providing a third clock signal when the substrate voltage is not a predetermined level; and
    an oscillator driver for providing a bias voltage to said oscillator according to the third clock signal received from said level detector.

2. A substrate voltage generator according to claim 1, wherein the means for compensating for temperature variations comprises a temperature dependent resistance means.

3. A substrate voltage generator according to claim 2, wherein the temperature dependent resistance means comprises at least one semiconductor device arranged in a power supply to said oscillator, said power supply including two terminals at first and second voltage levels respectively.

4. A substrate voltage generator according to claim 3, wherein at least one semiconductor device comprises an MOS (metal oxide semiconductor) transistor.

5. A substrate voltage generator according to claim 1, wherein said oscillator includes an odd number of inverters, a pair of PMOS transistors connected between one terminal of a power supply and each of said inverters, and a pair of NMOS transistors connected between said inverters and another terminal of the power supply.

6. A substrate voltage generator according to claim 1, wherein said voltage pump includes:
    first to fourth MOS transistors serving as pumping capacitors, having sources and drains commonly connected at first terminals of said transistors, one of said clock signals from said voltage pump driver being applied to the first terminals of the first and third of said MOS transistors, and the other of said clock signals from said pump driver being applied to the first terminals of the second and fourth of said MOS transistors,
    fifth through eighth MOS transistors serving as first to fourth diodes, respectively, the fifth and eighth transistors having drains and gates commonly connected with gates of the first and fourth transistors, respectively, and sources connected to constitute a substrate voltage node, the sixth and seventh transistors having drains connected with gates of the second and third transistors, respectively, and sources and gates commonly connected to one terminal of a power supply for said generator.

7. A substrate voltage generator according to claim 6, wherein said fifth through eighth MOS transistors is each formed in a semiconductor substrate, said one clock signals being applied to the substrate of the fifth and seventh transistors, and said other of said clock signals being applied to the substrates of the sixth and eighth transistors.

* * * * *